United States Patent [19]
Flanigan

[11] Patent Number: 5,863,340
[45] Date of Patent: Jan. 26, 1999

[54] DEPOSITION RING ANTI-ROTATION APPARATUS

[76] Inventor: Allen Flanigan, 5935 Vista Loop, San Jose, Calif. 95124

[21] Appl. No.: 639,839

[22] Filed: May 8, 1996

[51] Int. Cl.⁶ .................................................. C23C 16/00
[52] U.S. Cl. .......................... 118/728; 118/500; 118/504; 118/720; 204/298.11
[58] Field of Search .................................. 118/720, 721, 118/728, 500, 504; 204/298.11

[56] References Cited

U.S. PATENT DOCUMENTS

| | | | |
|---|---|---|---|
| 4,189,230 | 2/1980 | Zasio | 355/76 |
| 4,788,994 | 12/1988 | Shinbara | 134/157 |
| 4,817,556 | 4/1989 | Mears et al. | 118/503 |
| 4,978,412 | 12/1990 | Aoki et al. | 156/345 |
| 5,040,484 | 8/1991 | Mears et al. | 118/503 |
| 5,228,501 | 7/1993 | Tepman et al. | 165/80.1 |
| 5,238,499 | 8/1993 | Van De Ven et al. | 118/724 |
| 5,304,248 | 4/1994 | Cheng et al. | 118/728 |
| 5,584,936 | 12/1996 | Pickering et al. | 118/728 |
| 5,620,525 | 4/1997 | Van De Ven et al. | 118/728 |
| 5,624,499 | 4/1997 | Mizuno et al. | 118/725 |
| 5,632,873 | 5/1997 | Stevens et al. | 204/298.15 |
| 5,643,366 | 7/1997 | Somekh et al. | 118/721 |

FOREIGN PATENT DOCUMENTS 0 242 065 10/1987 European Pat. Off. .
684602 A5 10/1994 Switzerland .

*Primary Examiner*—R. Bruce Breneman
*Assistant Examiner*—Jeffrie R. Lund
*Attorney, Agent, or Firm*—Thomason & Moser

[57] ABSTRACT

Apparatus for limiting the rotation of a deposition ring relative to a substrate support. Specifically, the deposition ring is rotatably affixed to the substrate support. In a first embodiment of the apparatus, an anti-rotation pin is affixed to a deposition ring that circumscribes a substrate support such as an electrostatic chuck. An anti-rotation bracket is attached at a first end to the substrate support. A second end is coupled to the anti-rotation pin. As such, the deposition ring has some degree of freedom to adjust to thermal expansion of the deposition ring and the substrate support; however, the deposition ring is prevented by the interaction of the anti-rotation pin and bracket from rotating to a point where the deposition ring becomes stuck to the substrate support. In an alternative embodiment of the apparatus, a anti-rotation pin or bump is formed on the underside of the deposition ring. A matching indentation is formed on a radially extending, circumferential flange extending from the substrate support and supporting the deposition ring. The pin and indentation interact to limit the amount of rotation that can be attained by the deposition ring.

9 Claims, 1 Drawing Sheet

5,863,340

DEPOSITION RING ANTI-ROTATION APPARATUS

BACKGROUND OF THE DISCLOSURE

1. Field of the Invention

The invention relates to a deposition ring used in semiconductor wafer processing systems. More particularly, the invention relates to apparatus for limiting the rotation of a deposition ring relative to a substrate support chuck that is circumscribed by the deposition ring.

2. Description of the Background Art

In deposition processes, species from a source such as a target, a gas inlet manifold and the like may deposit on exposed internal chamber surfaces, including the chamber walls and hardware. Shields are available which are designed to intercept such species. One portion of such a shield is a deposition ring (also known as a waste ring) that generally circumscribes a substrate support such as an electrostatic chuck and is designed to prevent deposition upon the edges of the substrate support. A substrate support typically contains a radially extending, circumferential flange that supports the deposition ring proximate the edge of the substrate support surface that is designed to support a workpiece such as a semiconductor wafer.

Typically, a substrate support, although generally circular in plan form, has one edge that is flat. The flat edge, circular shape matches the shape of a typical semiconductor wafer. Such a flat edge is used to easily orient the wafer during processing. So that the deposition ring can circumscribe the substrate support, the deposition ring also contains a flat portion of its inner circumference such that the geometry of the deposition ring substantially matches the plan form of the substrate support.

The deposition ring inner circumference is slightly larger than the outer circumference of the chuck. Such a size differential is necessary to ensure that the different materials comprising the ring (typically stainless steel) and the substrate support (typically ceramic or dielectric) are permitted to freely expand and contract in response to the extreme temperatures produced in a semiconductor wafer processing system.

The deposition ring, during thermal cycling, slides about the substrate support, i.e., the deposition ring rotates about the substrate support. At room temperature, the rotation is typically 0.35 to 1.5 degrees. However, at 400 degrees Celsius, the rotation can exceed 3 degrees. As a result, the flat portion of the deposition ring inner circumference contacts the edge of the substrate support at the point where the flat edge meets the circular edge. As the temperature within the processing system cools, the deposition ring contracts at a rate faster than the substrate support. If cooled while the deposition ring is in the excessively rotated position, the ring produces substantial inwardly directed force (compressive force) at the circumferential contact points between the ring and the support. As a result, the ring becomes "stuck" and cannot be easily removed from the substrate support. Such compressive force can permanently damage the substrate support.

Therefore, a need exists in the art for apparatus that limits the rotation of the deposition ring with respect to a substrate support that is circumscribed by the ring.

SUMMARY OF THE INVENTION

The disadvantages heretofore associated with the prior art is overcome by apparatus for limiting the rotation of a deposition ring relative to a substrate support. Specifically, the deposition ring is rotatably affixed to the substrate support.

In a first embodiment of the invention, an anti-rotation pin is affixed to a deposition ring that circumscribes a substrate support such as an electrostatic chuck. An anti-rotation bracket is attached at a first end to the substrate support. A second end is coupled to the anti-rotation pin. As such, the deposition ring has some degree of freedom to adjust to thermal expansion of the deposition ring and the substrate support; however, the deposition ring is prevented by the interaction of the anti-rotation pin and bracket from rotating to a point where the deposition ring becomes stuck to the substrate support.

In an alternative embodiment of the invention, a anti-rotation pin or bump is formed on the underside of the deposition ring. A matching indentation is formed on a radially extending, circumferential flange extending from the substrate support and supporting the deposition ring. The pin and indentation interact to limit the amount of rotation that can be attained by the deposition ring. However, as with the previous embodiment, the ring and substrate support are able to freely expand and contract with the thermal cycling of the semiconductor wafer processing system.

Using either embodiment of the present invention, the rotation between the deposition ring and the chuck is substantially limited even at high temperatures. As such, the deposition ring can not become stuck to the substrate support.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
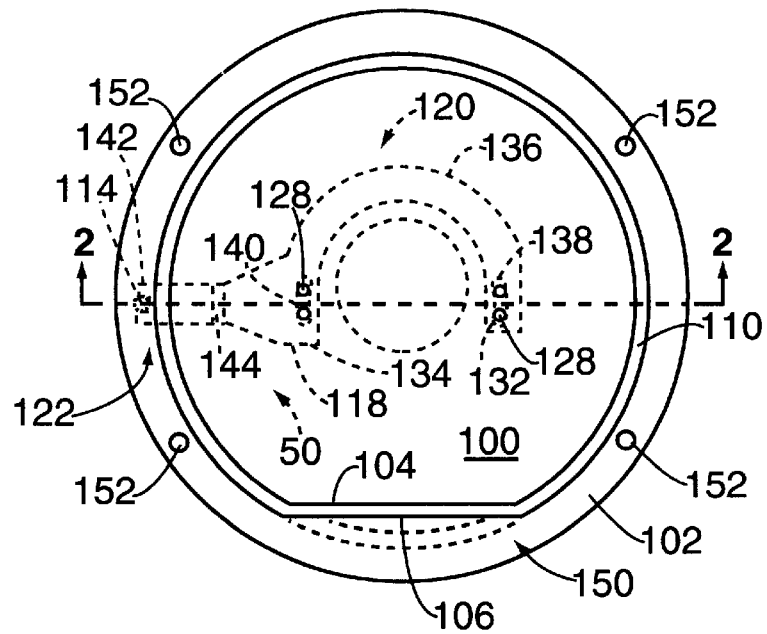
FIG. 1 depicts a top plan view of apparatus for limiting rotation of a deposition ring relative to a substrate support.
Figure 2:
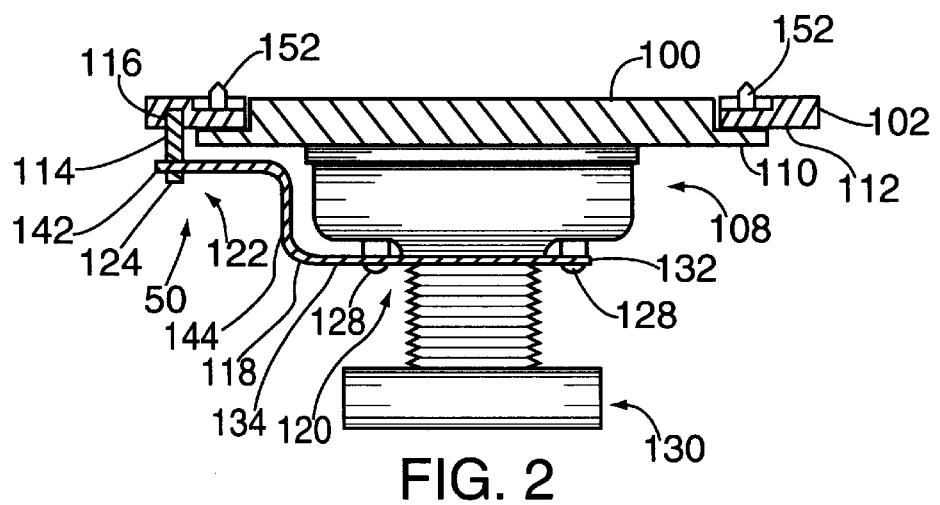
FIG. 2 depicts a vertical cross-sectional view of the apparatus of FIG. 1 taken along line 2—2.

FIG. 1 depicts a top, plan view of a substrate support 100 that is circumscribed by a deposition ring 102 (also known as a waste ring) having apparatus 50 for limiting the rotation of the ring 102 with respect to the support 100. FIG. 2 depicts a vertical cross-sectional view of the apparatus of FIG. 1 taken along line 2—2. To best understand the invention, the reader should simultaneously refer to both FIGS. 1 and 2.

Specifically, the support 100 is substantially circular having a flat portion 104. To achieve alignment of the ring and support, the deposition ring 102 also contains a similar flat portion 106. The substrate support is generally supported upon a chucking apparatus 108 such as an electrostatic chuck (not specifically shown) for retaining a workpiece or substrate upon the surface of the substrate support. In some substrate processing applications, the chucking apparatus may also contain a substrate support heating assembly (not shown).

The support 100 contains a flange 110 that extends radially from the support and circumscribes the entire support. This flange 110 supports an underside surface 112 of the deposition ring 102. To this underside surface is affixed an anti-rotation pin 114. The pin 114 is affixed by having a threaded bore 116 in the underside of the ring and having matching threads on a first end of the pin 114. The pin extends approximately 2.54 cm (1 inch) from the ring 102. The pin mounting location is not critical to the invention. The specific attachment location is a design choice that is dictated by the substrate support apparatus and the geometry of the system in which the invention is used. Importantly, the pin must not be positioned where it may interfere with access to the substrate support by a robotic substrate transport assembly.

Further, the apparatus 50 for limiting the rotation of the ring relative to the support, includes a anti-rotation bracket 118. The bracket 118 has a first end 120 affixed to the support 100 and a second end 122 coupled to a second end 124 of the anti-rotation pin 114. The first end 120 of the bracket 118 contains a pair of mounting portions 132 and 134 that are interconnected by a interconnection portion 136. The bracket is affixed to the support 100 by, for example, four screws, two screws 128 on either side of the support mount 130. These screws pass through slots 138 and 140 that are respectively located in the mounting portions 132 and 134.

The bracket 118 further connecting portion 144 that connects the first end 120 of the bracket to the second end 122 thereof. The cross section of the bracket is substantially an S-shape having the second end 122 extending from the top of the connecting portion and the first end 120 extending from the bottom of the connecting portion. The particular shape of the bracket is defined by the specific substrate support assembly design. For example, if a lift hoop is provided for guiding substrate lift pins, the bracket may have to be adapted to avoid the hoop. Thus, the particular bracket geometry shown should be considered illustrative of a bracket design and not a particular limitation of the invention. Many other bracket geometries are available and all of those are considered within the scope of the present invention.

The distal end 142 of the second end 122 is adapted to couple to the second end 124 of the anti-rotation pin 114. The adaptation is a Y-shape or forked end to the bracket 118 that interfits the pin diameter (e.g., approximately 0.19 inches). Alternatively, the bracket end 142 could contain a slot that rotatably couples to the pin.

This embodiment of the invention, provides an effective anti-rotation apparatus for substantially limiting the rotation of the deposition ring relative to the support substrate. The anti-rotation bracket and pin combine to rotatably fix one point of the deposition ring relative to the substrate support. Such an arrangement effectively limits the ability of the ring to rotate, but does not substantially interfere with the expansion and contraction of the ring and support during thermal cycling of the apparatus.

Figure 3:
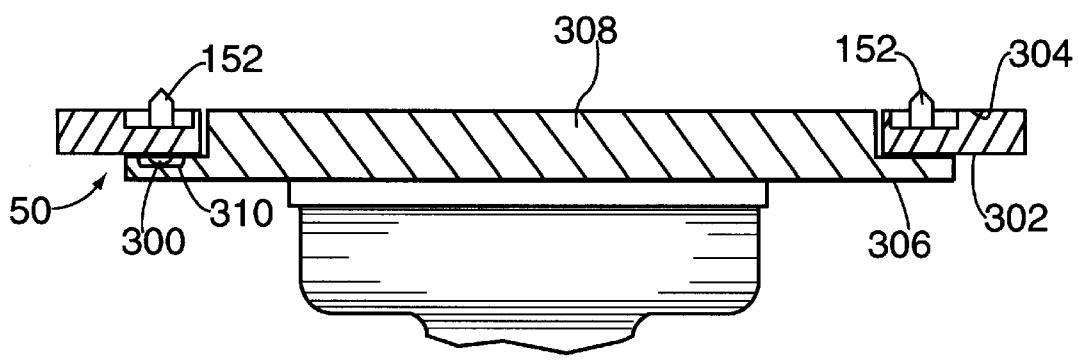
FIG. 3 depicts a vertical cross-sectional view of an alternative embodiment of the present invention.

FIG. 3 depicts a vertical cross-sectional view of an alternative embodiment of the invention. This embodiment has a pin or bump 300 formed on the underside surface 302 of the deposition ring 304. The radially extending, circumferential flange 306 of the substrate support 308 contains an indentation 310, e.g., a radially directed slot. The slot is sized and positioned to coupled to the pin 300. As such, the pin and slot combination form the rotatable affixation point between the deposition ring 304 and the support 308. Alternatively, the slot could be located in the underside surface of the deposition ring and the pin located on the flange. This embodiment of the invention, i.e., coupling a pin and slot located in the ring and support or vice versa, also limits the degree of rotation of the ring relative to the support, but does not substantially interfere with the thermal expansion and contraction of the ring and support.

Of course, the number of anti-rotation pins that are coupled to brackets or slots in the support can be increased. Thus, the invention should be understood to include one or more anti-rotation pins coupled to a similar number of brackets or slots.

Furthermore, the invention is useful for use with a substrate support and a deposition ring which do not have flat portions. Such a ring and support are illustrated by dashed lines 150 in FIG. 1. In this manner, the anti-rotation apparatus 50 limits the rotation of the deposition ring relative to the support such that the substrate alignment pins 152 are relatively stationary during thermal cycling that would otherwise cause ring rotation.

Although a pin and bracket or pin and slot embodiments for the anti-rotation apparatus 50 permit easy removal of the deposition ring from the support, i.e., the ring is not bolted or screwed to the support, other means for attaching the ring to the support are useful. For example, a threaded bore into the flange and a matching bore through the ring can be used to attach the ring to the support via a screw or bolt. To ensure freedom of motion during thermal cycling the bore in the ring can be larger than the diameter of the attachment screw or the bore could be a slot.

Although various embodiments which incorporate the teachings of the present invention have been shown and described in detail herein, those skilled in the art can readily devise many other varied embodiments that still incorporate these teachings.

What is claimed is:

1. Apparatus comprising:
    a deposition ring having an inner circumference with a first portion that aligns with a second portion located on an outer circumference of a substrate support wherein said inner circumference is greater than said outer circumference;
    a pin attached to said deposition ring; and
    a bracket, attached to said substrate support, and coupled to said pin.

2. The apparatus of claim 1 wherein said bracket is attached at a first end to the substrate support and, at a second end, has a forked portion that interfits said pin.

3. Apparatus comprising:
    a deposition ring having an inner circumference with a first portion that aligns with a second portion located on an outer circumference of a substrate support wherein said inner circumference is greater than said outer circumference;
    means, attached to the deposition ring, for providing a coupling point to said deposition ring; and
    means, attached to the substrate support and coupled to said coupling point providing means, for rotatably affixing a point on said deposition ring to said substrate support, wherein said means for rotatably affixing comprises a bracket, attached to said substrate support, and coupled to said coupling point providing means.

4. The apparatus of claim 3 wherein said coupling point providing means is a pin.

5. The apparatus of claim 3 wherein said bracket is attached at a first end to the substrate support and, at a second end, has a forked portion that interfits said coupling point providing means.

6. The apparatus of claim 5 wherein said coupling point providing means is a pin that interfits said forked portion.

7. The apparatus of claim 3 wherein said bracket is attached at a first end to the substrate support and, at a second end, has a slotted portion that interfits said coupling point providing means.

8. The apparatus of claim 7 wherein said coupling point providing means is a pin that interfits said slotted portion.

9. Apparatus for limiting rotation of a deposition ring relative to a substrate support that the deposition ring circumscribes, said apparatus comprising:

a pin attached to an underside of said deposition ring;

an S-shaped bracket, attached to said substrate support, said bracket having a forked distal end that interfits a diameter of said pin.

* * * * *